United States Patent [19]

Wang

[11] 3,826,932

[45] July 30, 1974

[54] AN ULTRASONIC CONVOLVER HAVING PIEZOELECTRIC AND SEMICONDUCTOR PROPERTIES

[76] Inventor: Wen-Chung Wang, 25 Trescott Path, Northport, N.Y. 11768

[22] Filed: Apr. 17, 1972

[21] Appl. No.: 244,429

[52] U.S. Cl. .................... 310/8.1, 310/9.8, 330/5.5, 333/30 R

[51] Int. Cl. .......................... H01v 7/00, H04r 17/00

[58] Field of Search .................. 310/8, 8.1, 9.7, 9.8; 333/30 R; 330/5.5

[56] References Cited

UNITED STATES PATENTS

| | | | |
|---|---|---|---|
| 2,596,460 | 5/1952 | Arenberg | 333/30 R |
| 2,917,669 | 12/1959 | Yando | 333/30 R |
| 3,479,572 | 11/1969 | Pokorny | 310/8.1 UX |
| 3,551,837 | 12/1970 | Speiser | 310/9.8 X |
| 3,568,102 | 3/1971 | Tseng | 310/9.8 UX |
| 3,582,540 | 6/1971 | Adler | 310/8.1 UX |
| 3,582,840 | 6/1971 | De Vries | 333/30 R X |
| 3,665,211 | 5/1972 | Owens | 310/8.1 X |
| 3,681,579 | 8/1972 | Schweitzer | 333/30 R X |
| 3,684,892 | 8/1972 | Lean et al. | 330/5.5 |

OTHER PUBLICATIONS

Amplifying Acoustic Surface Waves, by Collins et al., 12-8-69, pp. 102-111.

Parametric Amplification of Surface Acoustic Waves, by Chao, Applied Physics Letters, Vol. 16, No. 10, 5-15-70, pp. 399-401.

Convolution and Time Inversion Using Parametric Interactions of Acoustic Surface Waves, by Luukkala et al., Applied Physics Letters, Vol. 18, No. 9, pp. 393-394.

Convolution and Correlation in Real Time with Non-Linear Acoustics, by Quate et al., Applied Physics Letters, Vol. 16, No. 12, pp. 494-496.

Surface Elastic Waves, by White, Proceedings of the IEEE, Vol. 58, No. 8, pp. 1,238-1,276.

Acoustic Wave Amplifier Having a Coupled Semi-Conductor Layer, by Fang et al., IBM Technical Disclosure Bulletin, Vol. 13, No. 11, p. 3,487.

*Primary Examiner*—J. D. Miller
*Assistant Examiner*—Mark O. Budd
*Attorney, Agent, or Firm*—Darby & Darby

[57] ABSTRACT

A device for performing the function of convolution comprises either a properly oriented piezoelectric semiconductor or a properly oriented piezoelectric insulator with an adjacent semiconductor and means for launching ultrasonic waves into or on the piezoelectric crystal. When one launches ultrasonic waves from the opposite ends of a piezoelectric crystal so that the two waves travel toward each other, when the two waves meet, a rf signal of large amplitude, at the sum frequency of the ultrasonic waves, will be detected by the semiconductor and the envelope (time function) of the sum-frequency rf signal represents the convolution integral between the two envelopes of the ultrasonic waves which were launched into the crystal is d-c biased to enhance the signal and in other configurations the semiconductor is not d-c biased.

3 Claims, 13 Drawing Figures

PATENTED JUL 30 1974 3,826,932

SHEET 7 OF 8

AN ULTRASONIC CONVOLVER HAVING PIEZOELECTRIC AND SEMICONDUCTOR PROPERTIES

In signal processing and in data processing it is often desirable to electronically process two signals in real time to produce a third signal which is a complex function of the two given signals. One such complex function which is useful to produce is the convolution function. Another useful function is the correlation function.

It has been known for some time that the process of convolution (or correlation) occurs in real time as a result of non-linear interaction of acoustic signals. Note for example "Convolution and Correlation in Real time with Non-linear Acoustics," C. F. Quate and R. B. Thompson "Applied Physics Letters," Vol. 16, page 494, 1970.

Efforts to produce a practical ultrasonic convolver have previously met with various difficulties, perhaps the most important of which was the inability to pick up an electrical signal representative of the convolution function which was not exceedingly weak as compared with the input signals (i.e. on the order of a million to a billion times less powerful for example). This situation makes it most difficult to distinguish reliably the convoluted signal from the unavoidably present noise signal.

The present device in its several variations utilizes different interactions than in prior experiments, and due to the combined properties of piezoelectricity and semiconductivity which it exploits provide a much stronger signal and other advantages.

The advantages of the invention will be better understood by reference to the following description in conjunction with the drawings in which:

FIGS. 1*a* to 1*h* are illustrations of embodiments of the invention.

Figure 3:
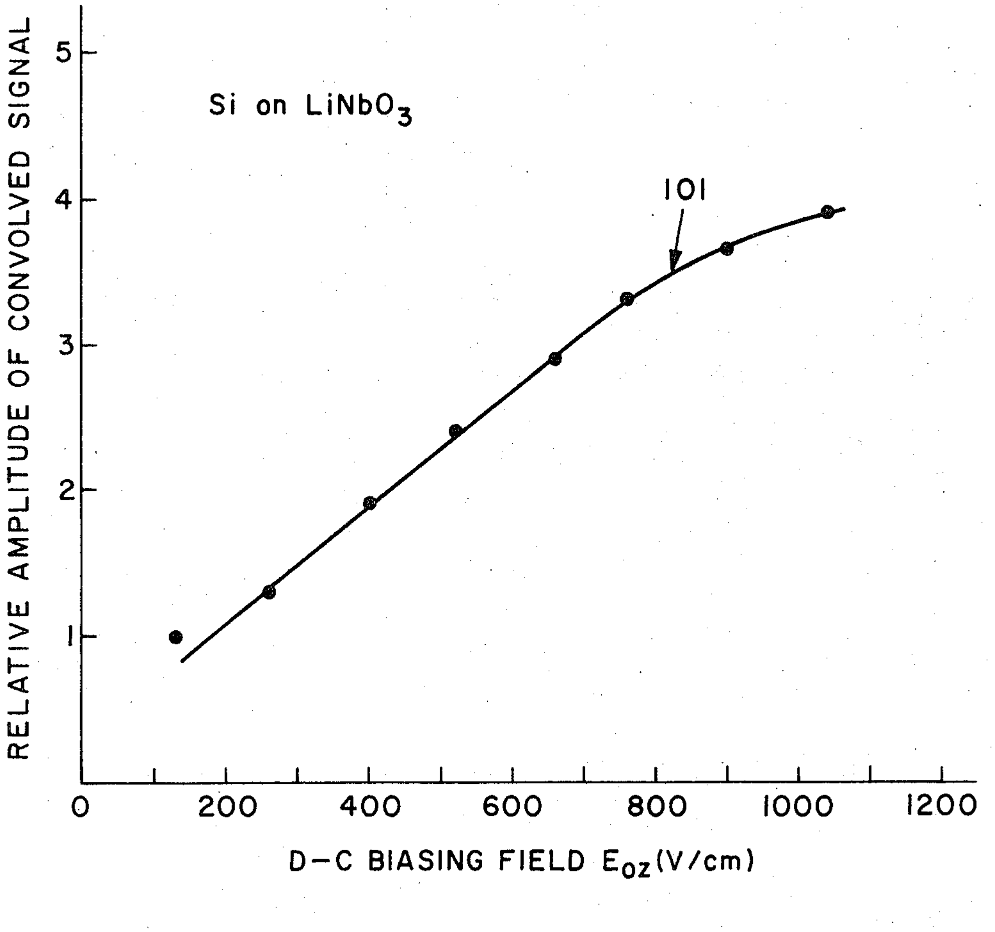
FIG. 3 shows relative amplitude of convolved signal as a function of d-c biasing field $E_o$. Input frequencies: $\omega_+ = \omega_- = 34$ MC (FIG. 1*c* configuration).
Figure 4:
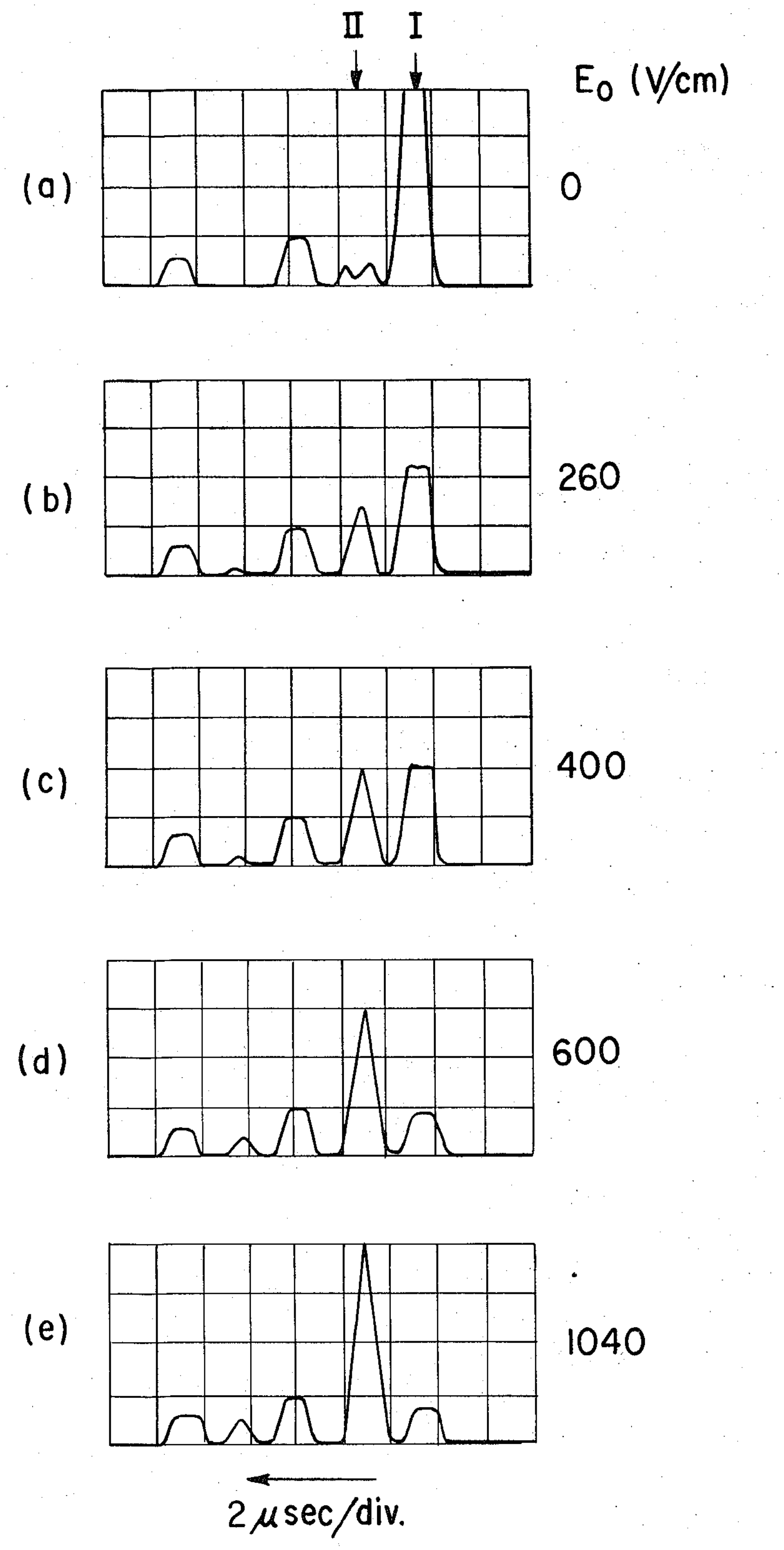

FIG. 4 shows oscilloscope displays corresponding to some selected points in FIG. 3. R.f. pulse I is the input signal radiating through the air. R.f. pulse II is the convolved signal. Other pulses are spurious signals.

Figure 1A:
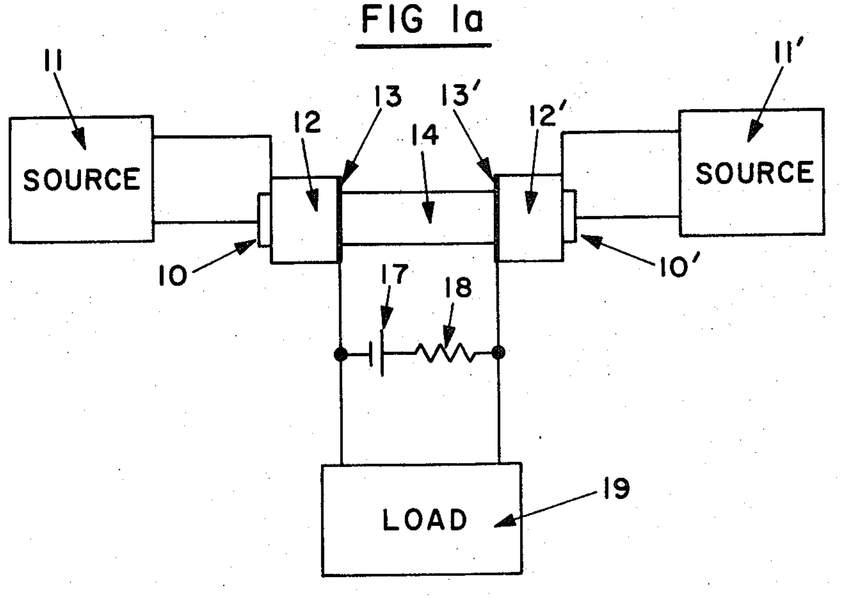
Figure 1B:
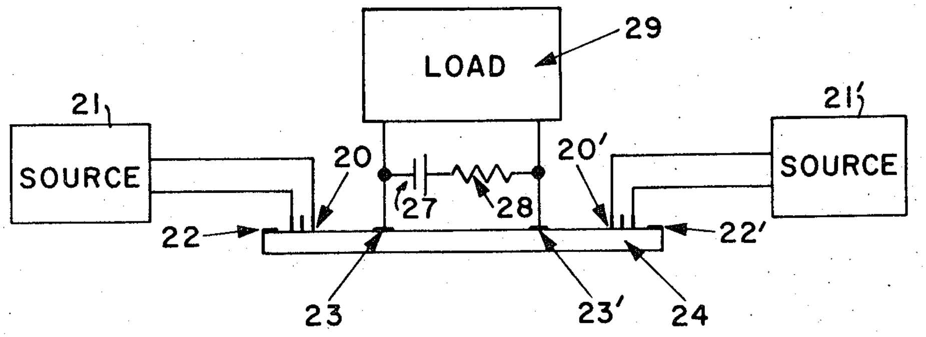
Figure 5:
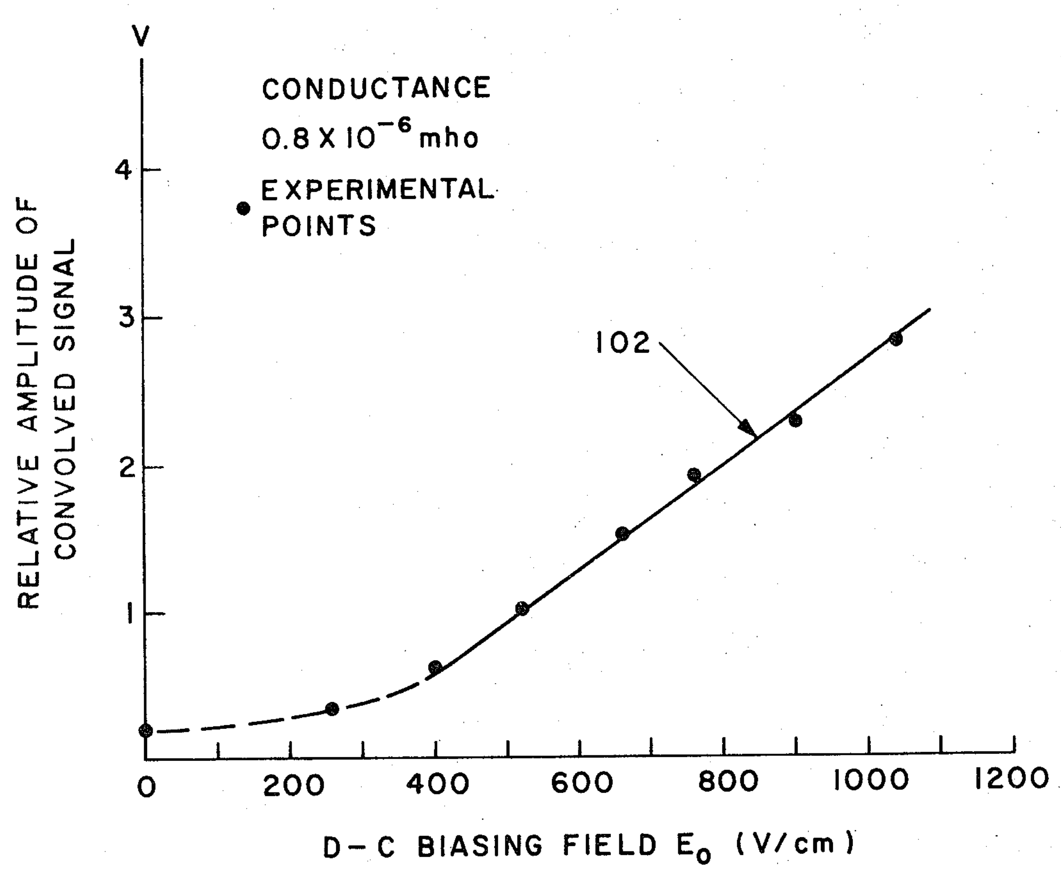

FIG. 5 shows relative amplitude of the convolved signal, $V_{oc}$ $(2\omega t)$ as a function of the pulsed d-c field (using configuration of FIG. 1*b*).

Figure 6:
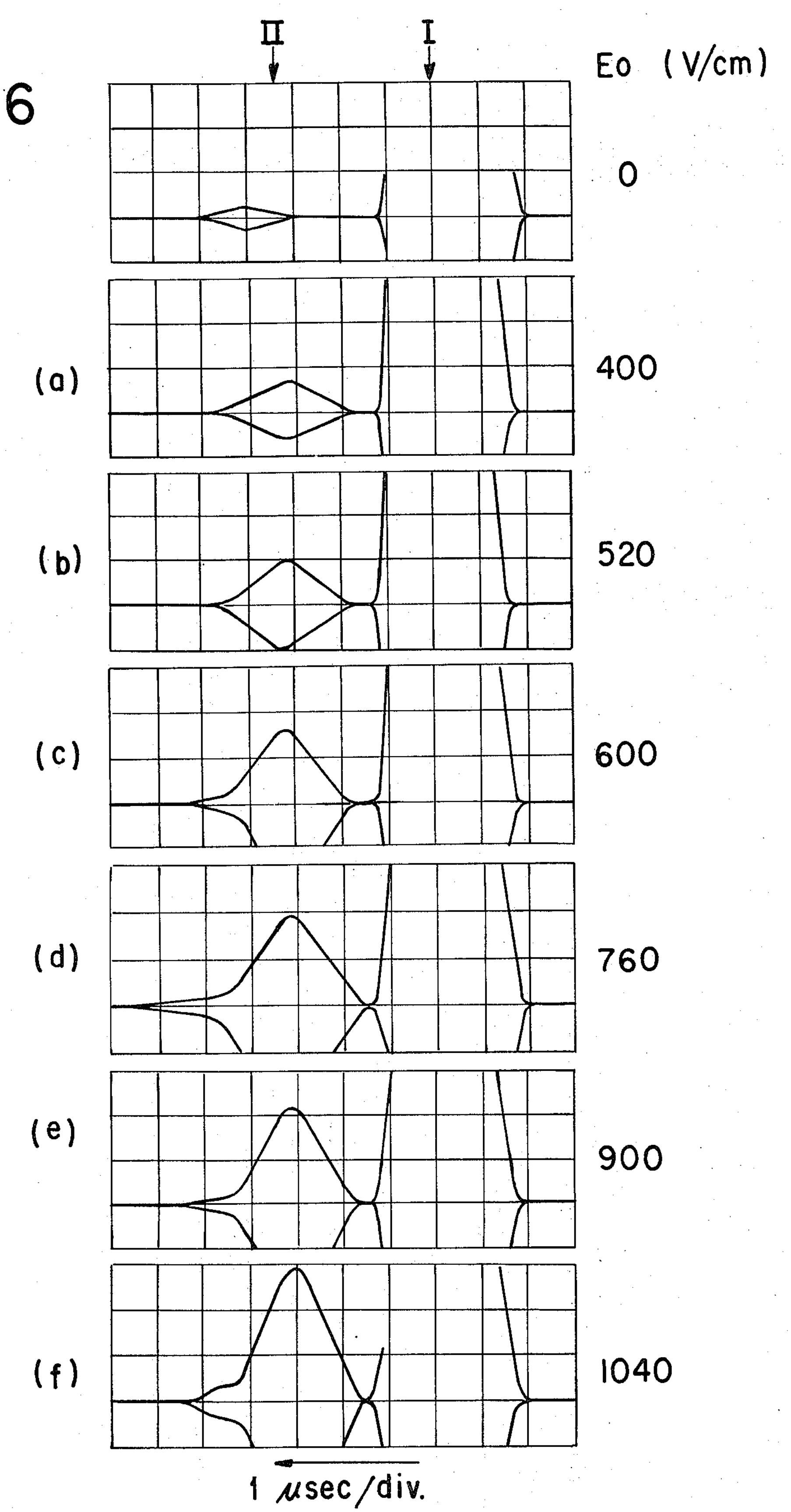

FIG. 6 shows oscilloscope displays corresponding to points in FIG. 5. R.f. pulse I is the input signal radiating through the air. R.f. pulse II is the convolved signal (FIG. 1*b* configuration).

In FIG. 1*a* the two input signals to be convolved are applied to the transducers 10 and 10' from sources 11 and 11'. Illustratively, 10 and 10' are of about fifteen megacycle transducers. The ultrasonic waves generated by the transducers 10 and 10' propagate toward each other passing through the buffer rods 12 and 12', and entering a properly oriented piezoelectric semiconductor 14. The piezoelectric semiconductor can be CdS, ZnO, GaAs, etc. The buffer rods are used to provide additional time delay. (Buffer rods often are not necessary and can be eliminated). A d-c voltage source or a pulsed d-c source 17 is applied to the semiconductor 14. Electrodes on the semiconductor are designated by 13 and 13'. A resistor 18 is connected in series with the d-c source 17. Convolved signals are taken at the output terminals 19.

Figure 1C:
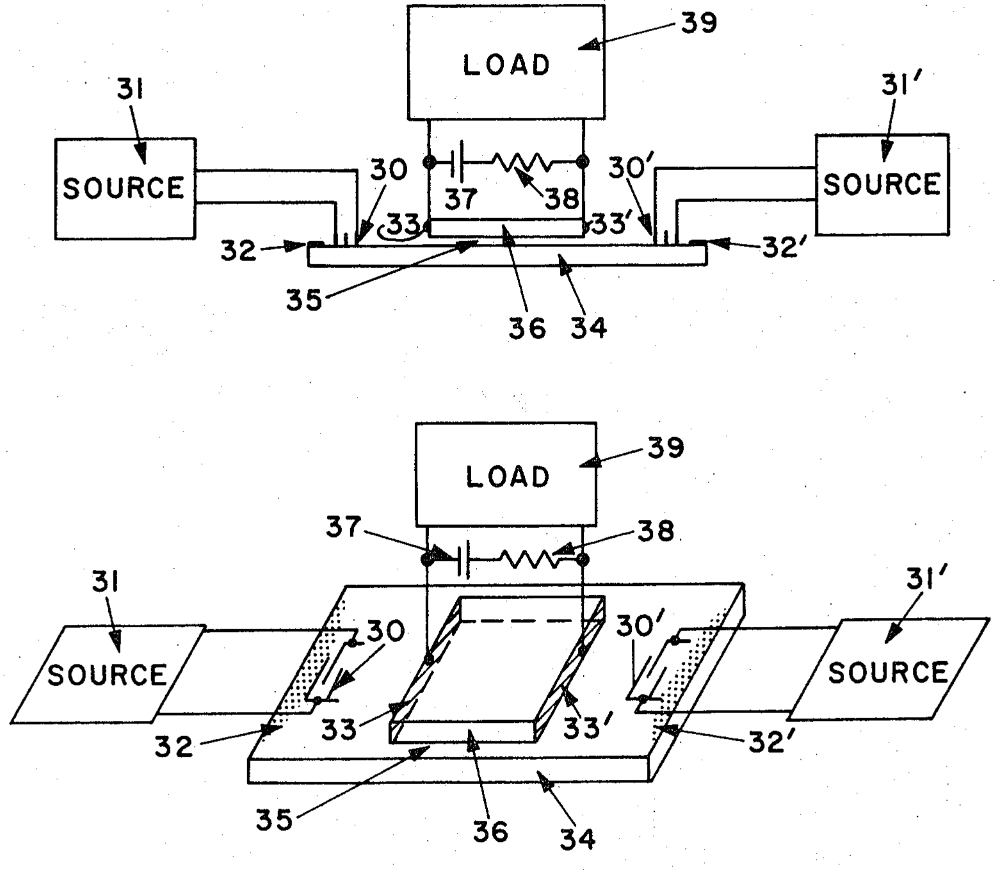
Figure 1D:
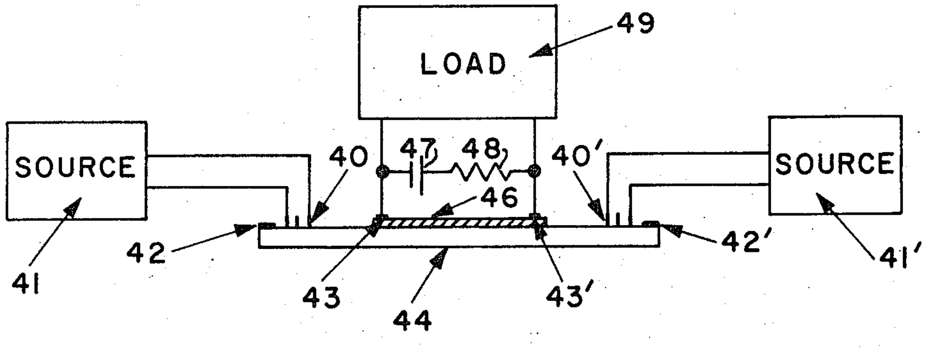

The operation principle of the configurations shown in FIGS. 1*b*, 1c and 1d are similar to that of FIG. 1*a*, but here surface waves are used.

In FIG. 1b a pair of (illustratively 17 megacycle) interdigital surface wave transducers, 20 and 20', are deposited on the optically polished planar top surface of the properly oriented piezoelectric semiconductor substrate 24. These two transducers are positioned respectively at opposite ends of the surface to provide means for generating the surface waves. The transducers 20 and 20' are connected to the signal sources 21 and 21' respectively. For eliminating undesired signals reflected from the substrate edges, standard measures such as placing wax or tapes near the edges 22 and 22' are used. 23 and 23' are the deposited metal electrodes. A d-c voltage source or a pulsed d-c source 27 is applied to the semiconductor through the resistor 28. It should be mentioned that the locations of the electrodes 23 and 23' can be changed so long as the electric field provided by the d-c voltage source 27 is along the path of sonic propagation. Convolved signal output is taken at output terminals 29.

Figure 1E:
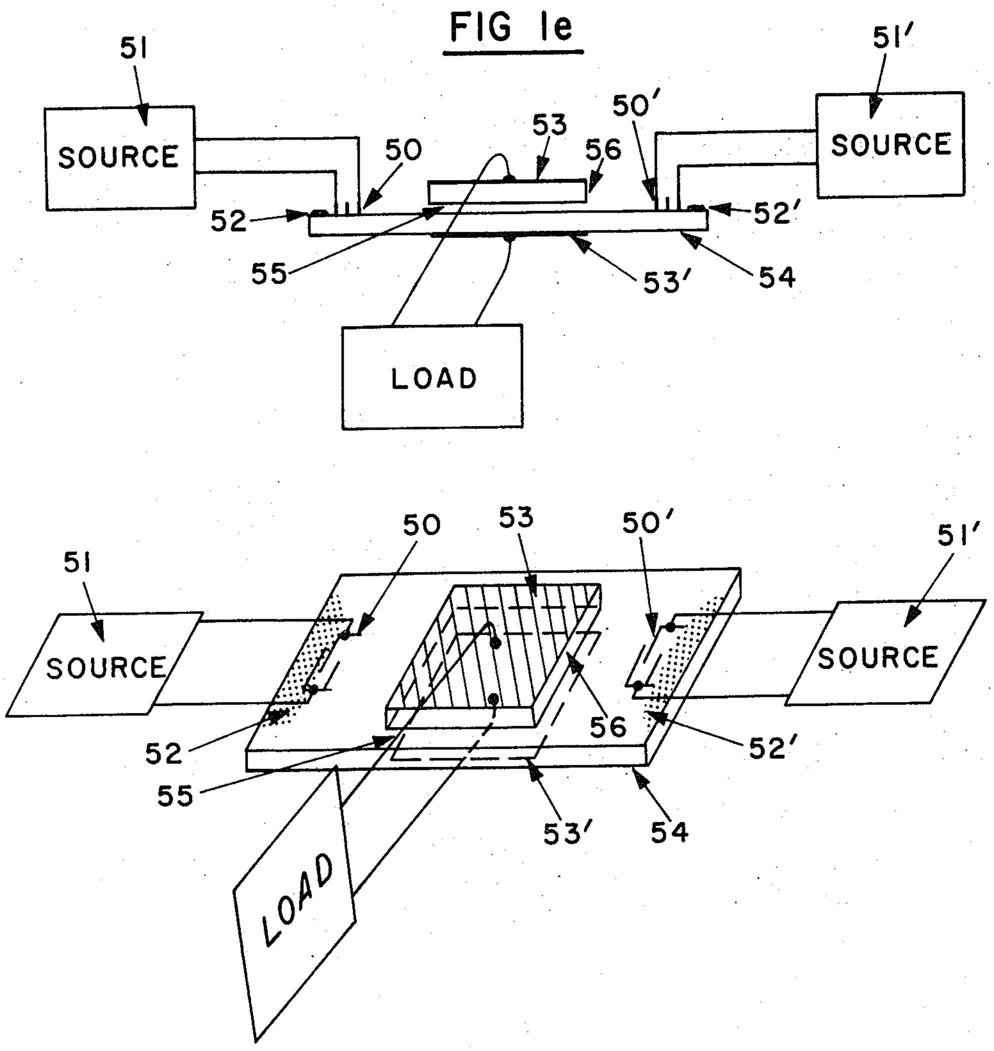
Figure 1F:
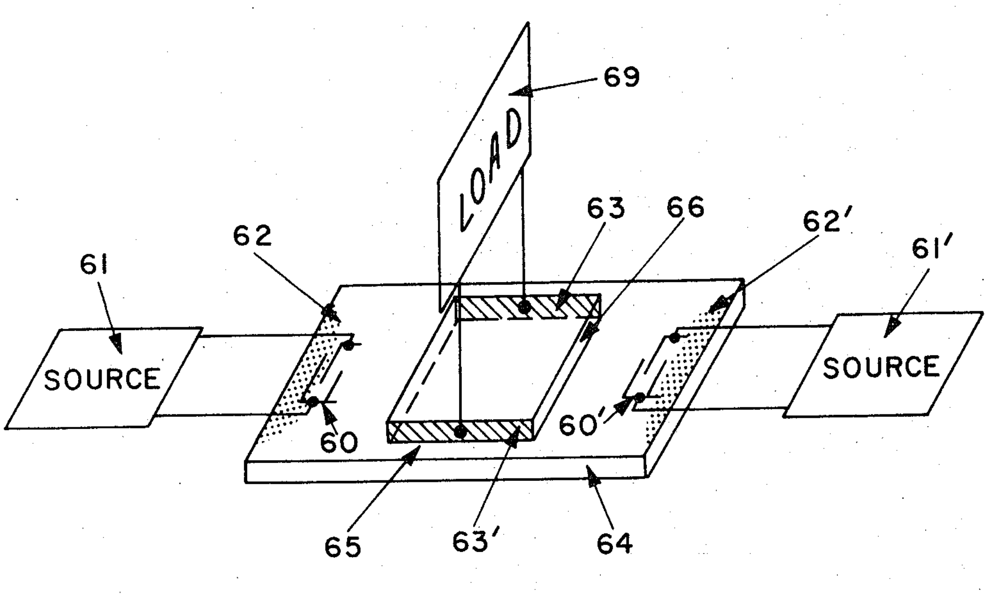
Figure 1G:
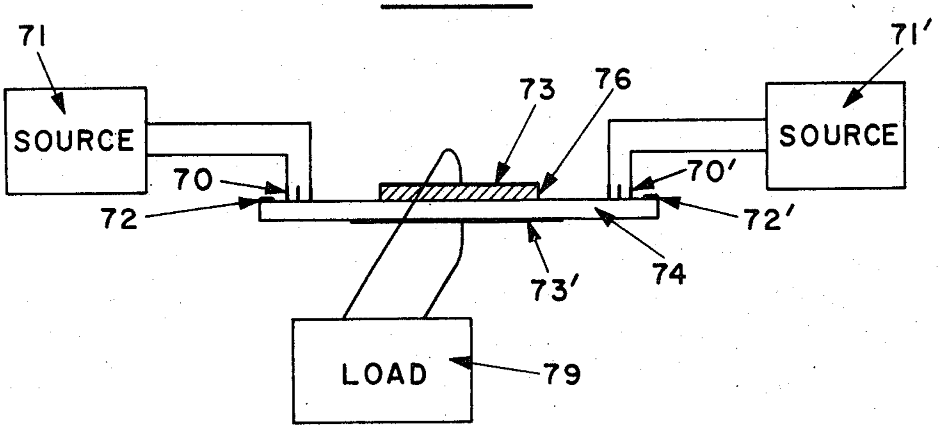
Figure 1H:
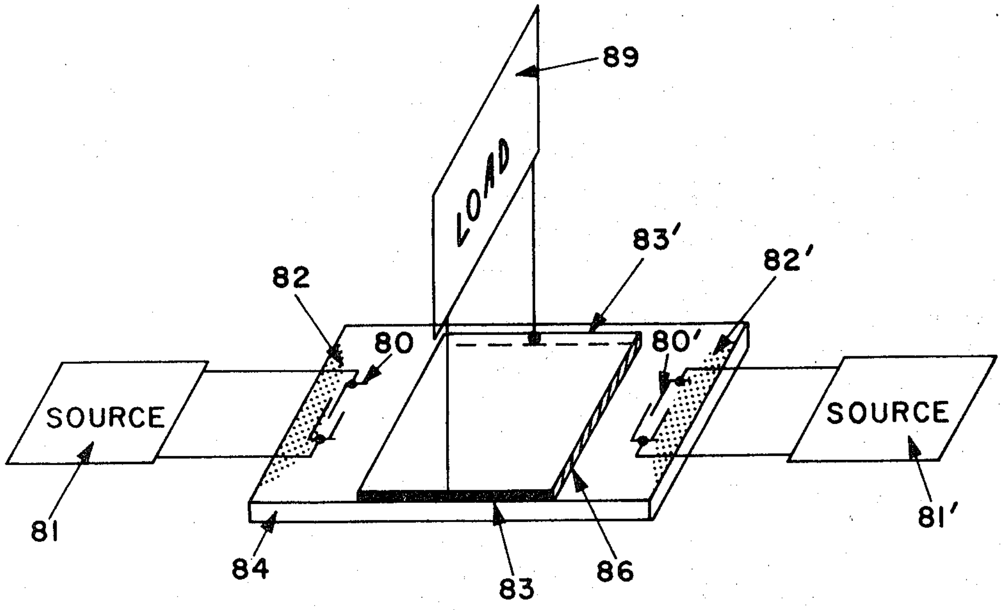

In FIG. 1*c*, similarly a pair of (illustratively about thirty four megacycle) interdigital surface wave transducers 30 and 30' are deposited on the optically polished planar top surface of a properly oriented piezoelectric substrate 34. The piezoelectric substrate can be $LiNbO_3$, poled PZT or other piezoelectric insulators. The transducers 30 and 30' are connected to the signal sources 31 and 31' respectively. Wax tapes or other means for 32 and 32' are used to eliminate undesired signals. The adjacent solid medium 36 is a semiconductor plate such as Si, CdS or other types of semiconductor. The resistivity of the semiconductor plate 36 should be chosen for optimum operation. The semiconductor 36 may be provided with a polished bottom surface. This surface is disposed adjacent the top surface of the substrate 34 shown in the figure. The respective bottom and top surfaces of the semiconductor 36 and the substrate 34 are separated by a very narrow air gap 35. The air gap 35 is used to avoid disturbance to the surface wave propagation and also to avoid unnecessary attenuation on the surface waves. (However, if one decides that these problems are minor, another configuration shown in FIG. 1*d* can be used. In FIG. 1*d* semiconductor film 46 is deposited on the piezoelectric substrate 44. FIG. 1*d* is entirely equivalent to FIG. 1*c* except that here thin film semiconductor is used and air gap is eliminated. By "entirely equivalent" means that items 40, 40', 41, 41', 42, 42', 43, 43', 44, 47, 48 and 49 are corresponding to items 30, 30', 31, 31', 32, 32', 33, 33', 34, 37, 38, and 39 respectively). Items 33 and 33' are metal electrodes. A d-c voltage source or a pulsed d-c source 37 is applied to the semiconductor through a resistor 38. The d-c electric field provided by the d-c source 27 is along the path of the surface wave propagation. Convolved signals are taken at the output terminals 39. (Here in both FIGS. 1*c* and 1d the electric field waves and space charge waves are induced inside the semiconductor through strong piezoelectric coupling of the substrate, since the piezoelectric substrate is properly oriented). It should be mentioned that the d-c voltage source (17, 27, 37 and 47 in the respective configurations FIGS. 1*a*, 1*b*, 1*c* and 1*d*) can be removed; i.e., set to zero. Convolved signals will be still observed at the output terminals. The d-c source is used here to enhance the signal output. Without the use of a d-c source two additional configurations as shown in FIGS. 1*e* and 1*f* are found very efficient. In FIG. 1*e* the output electrodes 53 and 53' are placed differently from that in FIG. 1*c*. The metal electrode 53 covers the top surface of the semiconductor plate 56, and the other electrode 53' covers the bottom surface of the piezoelectric substrate 54. The bottom electrode 53' serves as the ground plate. 55 is a very narrow air gap. If the position of the semiconductor plate in FIG. 1*c* is oriented with an angle of ninety degrees, it will produce FIG. 1*f*. In fact, experiment shows that the semiconductor can be oriented at any angle, convolved signals are observed at the output terminals. An alternative configuration for FIG. 1*e* is shown in FIG. 1*g*, where semiconductor thin film 76 is deposited on the piezoelectric substrate 74 in place of the semiconductor plate and no air gap is present. Similarly, an alternative configuration for FIG. 1*f* is shown in FIG. 1h. It is noted that items 50, 60, 70 and 80 correspond to items 30, items 50', 60', 70' and 80' correspond to 30', items 51, 61, 71, 81, correspond to 31, items 51', 61', 71', 81', correspond to 31', items 52, 62, 72, 82, correspond to 32, items 52', 62', 72', 82' corresponds to 32', items 54, 64, 74, 84, correspond to 34, and items 59, 69, 79, 89 correspond to item 39. It should also be mentioned that in all the configurations except FIG. 1a for having proper electric ground, it is better to deposit metal film on the bottom surface of the piezoelectric substrate to serve as common electric ground. It is important to note that the particular kind of transducer may be varied, as desired, without departing from the scope of the invention. For example, interdigital surface transducers are preferred because they are efficient; however, wedge-type transducers (not shown) may also be used to generate surface waves in the substrate. Experimental structures corresponding to configurations in FIGS. 1*a*, 1*b*, 1*c*, 1*e* and 1*f* have been constructed and tested successfully. Theoretical understanding to the mentioned configurations is only partially obtained. Both experimental result and theoretical understandings are presented in the following.

When two oppositely directed ultrasonic waves propagate toward each other in or on a piezoelectric substrate, through nonlinear mixing, convolved signals at both the sum and difference frequencies will be generated. The sources responsible for the signal generation are thought due to the following: (i) nonlinear interaction between the strain waves, (ii) the interacting among the waves of electric fields and the displacement fields produced by the sonic waves and (iii) interaction between the electrical waves and space charge waves carried by the strain waves. The contributions due to (i) and (ii) have not been carefully examined, but, the contribution due to the interaction between the electrical waves and space charge waves has been examined in considerable detail. It is found however that, the contribution due to (iii) only becomes important when the d-c voltage (items 17, 27, 37, 47 in FIGS. 1*a*, 1*b*, 1*c* and 1*d*) is applied to the semiconductor. In order to understand the physical process described in FIGS. 1*a* to 1h all sources of contribution have to be carefully studied. Since so far we have only studied the process (iii) in detail, the process (iii) is going to be presented in relative detail.

In the presence of two oppositely directed ultrasonic waves, through piezoelectric coupling both space charge waves and electric field waves are induced inside the semiconductor, we can then represent the density of conduction electrons n and the electric field intensity E in the following form:

$$n = n_0 + \frac{1}{2} n_+ e^{i(k_+ x - \omega_+ t)} + \frac{1}{2} n_- e^{-i(k_- x + \omega_- t)} + \text{c.c.}$$

$$E = E_o + \frac{1}{2} E_+ e^{i(k_+ x - \omega_+ t)} + \frac{1}{2} E_- e^{-i(k_- x + \omega_- t)} + \text{c.c.} \quad (1)$$

where $k_+$, $k_-$, $\omega_+$, and $\omega_-$ are the wave vectors and frequencies of waves traveling in the $+x$ and $-x$ directions, respectively. $E_o$ is the electric field provided by the d-c voltage source. If L represents the interaction lengths of the sonic waves, the open circuit voltage across the output electrodes of the semiconductor is $$v_{oc}(t) = \frac{1}{\sigma_o} \int_0^L q\mu nE dx = \frac{1}{n_o} \int_0^L nE dx, \quad (2)$$

where $q$ is the electric charge, $\mu$ is the mobility.

Through the product of "$n$E" in Eq. (2) voltages at both the sum and difference frequencies are generated across the crystal. For clarity, Eq. (2) is going to be discussed for two special cases; in one case, the two frequencies are the same, $\omega_+ = \omega_-$ but the wave amplitude $E_+$ and $n_-$ etc., are modulated; in the other case the amplitudes are constants but frequencies differ.

CASE I. For $E_+$, $n_-$, . . . = const. and $\omega_+ = \omega_- = \omega$:

If the wave amplitudes are amplitude modulated, $n_+$, $n_-$, $E_+$, and $E_-$ would then be expressed in the functional forms $n_+\{vt - x\}$, $n_-\{vt + x\}$, $E_+\{vt - x\}$, and $E_-\{vt + x\}$. Assuming that the wave fronts of the two opposite travelling waves begin to overlap at time $t = 0$ and at the origin of the x axis, the magnitude of the open-circuit voltage at the sum frequency, $2\omega$, at time t is given by $$v_{oc}(2\omega t) = \frac{1}{n_o} \int_{-vt}^{vt} E_+\{vt - x\} n_-\{vt + x\} e^{-2i\omega t} dx + \text{c.c.}$$

where the space-charge effect due to amplitude modulation is ignored and $\omega_+ = \omega_- = \omega$ is assumed. If we let $x = x' - vt$, the above equation becomes $$v_{oc}(t) = \frac{e^{-i2\omega t}}{n_o} \int_0^{2vt} E_+\{2vt - x'\} n_-\{x'\} dx' + \text{c.c.} \quad (3)$$

The integral is recognized as the convolution integral.

CASE II. For $E_+$, $n_-$, . . . = const. and $\omega_+ \neq \omega_-$:

After performing the integration of Eq. (2) with some manipulation, the convolved signal at both the sum and difference frequencies can be expressed as $$v_{oc}(\omega_s t) = (n_- E_+ + n_+ E_-)/n_o \; (\sin[k_d(L/2)]/k_d \sin(\omega_s t + \phi_1) \quad (4)$$

$$v_{oc}(\omega_d t) = (n_- E_+ + n_+ E_-)/n_o \, (\sin[k_s(L/2)]/k_s \sin(\omega_d t + \phi_2) \quad (5)$$

where $\omega_s = \omega_+ + \omega_-$, $\omega_d = \omega_+ - \omega_-$ $k_s = k_+ + k_-$, $k_d = k_+ - k_-$ $\phi_1 = \tan^{-1}[\sin k_d L/1 - \cos k_d L]$, $\phi_2 = \tan^{-1}[\sin k_s L/1 - \cos k_s L]$.

Figure 2:
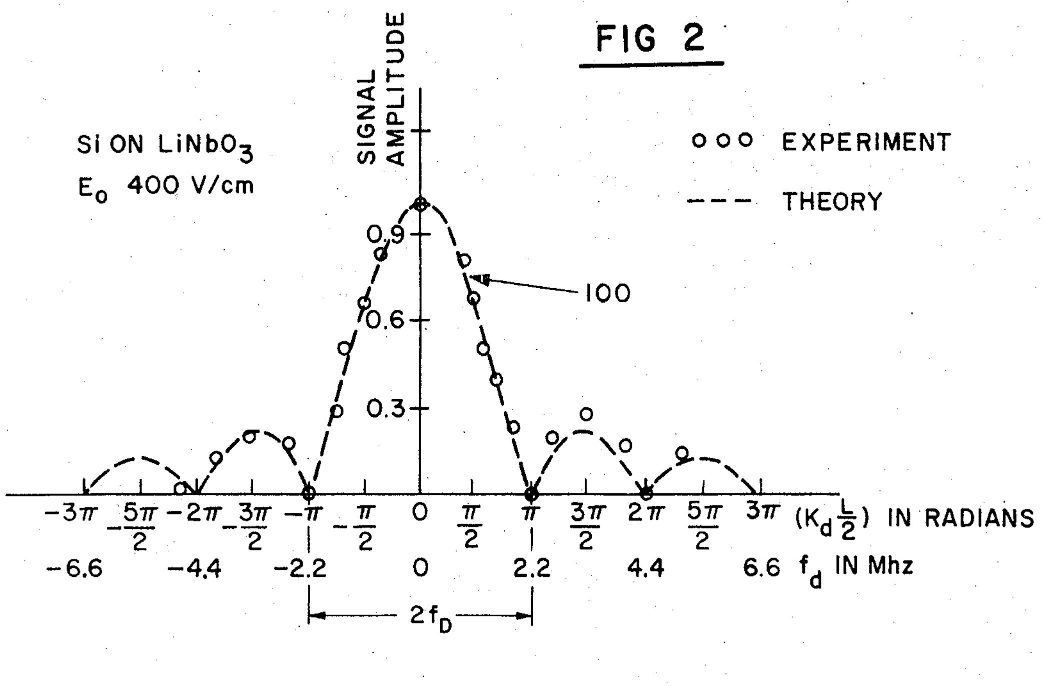
FIG. 2 shows normalized amplitude of convolved signal at the sum frequency as a function of the difference frequency $f_d$. Applied d-c field, $E_o=400$ volt/cm (using configuration of FIG. 1*c*).

When a phase matching condition is fulfilled, $k_d = 0$ and the current density at $\omega_s$ is spatially uniform, therefore, the output voltage predicted by Eq. (4) is a maximum. The difference signal of Eq. (5) is also observed experimentally. FIG. 2 depicts the experimental results of normalized amplitude of the convolved signal at the sum frequency, corresponding to the configuration of FIG. 1c - Si on $LiNbO_3$ → with $E_o = 400$ volt/cm. When $f_d = 0$, the frequency of the input signal is at 34 Mhz. The Si-plate is of dimensions 0.8 x 0.4 x 0.02 $(cm)^3$ with a resistivity ≈500 Ω-cm. The experimental data, expressed by circle O, is seen to be in general agreement with the theory predicted by Eq. (4) which is shown by curve 100 in FIG. 2. It is of interest to point out the relationship between the "spread of the two nodes" (designated by $2f_D$ in FIG. 2) and the interaction length L for nonlinear mixing. The interaction length $L$ is not necessarily equal to the separation distance between the output terminals. When "L" is shorter than the separation distance, $L/v_s$ corresponds to the shorter pulse duration of the two input signals. If one defines band width as the spread between two nodes, i.e., $BW = 2f_D$. Then, from Eq. (4), one obtains $$k_D(L/2) = \pi, \; f_D(L/v_s) = 1$$

$$BW = 2f_D = [2/\text{pulse duration}]. \quad (6)$$

When one of the signal durations is small, the $BW$ can be quite large indeed. Experiment agrees with Eq. (6).

The amplitude of the convolved signal as a function of the pulsed d-c field (pulse duration ≈20μsec) is shown by curve 101 in FIG. 3. $\omega_+ = \omega_- = 34$ Mhz. A series of pictures corresponding to some selected points on curve 101 in FIG. 3 is shown in FIG. 4. The triangular r.f. pulse (designated by II) is the convolved signal. The convolved signal amplitude at zero d-c field (picture a) is purposely adjusted to be minimal, so that the d-c voltage effect can be clearly demonstrated. Otherwise, by rearranging the output electrodes such as the configuration of FIG. 1*e*, the convolved signal amplitude has been observed at about 35db lower than the input signal. By using the configurations of FIG. 1*c* and FIG. 1f with properly electrical ground, (i.e., the bottom surface of the piezoelectric substrate is either deposited with a metal film or placed on a metal plate as common ground terminal) at zero d-c field the convolved signal has been observed at about 40db lower than the input signal. Using Eq. (3) for $\omega_+ = \omega_- = \omega$ and following White's derivation[7] one obtains $$V_{oc}(\omega_s t) = \frac{L}{2n_o}\{n_- E_+ + n_+ E_-\} \cos 2\omega t$$

$$= \frac{L}{2n_o}\left\{ \frac{2n_o \mu^2 E_+ E_-}{v_s^2} \; \frac{E_o}{[1 - R^2]} \right\} \cos 2\omega t$$

$$= \left(\frac{e}{\epsilon}\right)^2 \frac{L\mu}{v_s}$$

$$\frac{R S_+ S_- \cos(2\omega t + \phi)}{\{(1 - R^2)^2 + (1 + R^2)(\omega_c/\omega)^2 + (\omega_c/\omega)^4\}^{1/2}} \quad (7)$$

where $R = \mu E_o/v_s$, $S_+$ and $S_-$ are the strain amplitudes of the oppositely directed waves. The above equation does not reveal the full detail of the convolved signal as a function of the d-c field, since both the $S_+$ and $S_-$ are also functions of $E_o$. However, in the case $\omega_c >> \omega$ and $S_+ S_- \approx$ const., the convolved signal would be approximately in linear proportion to the d-c biasing field, which appears in agreement with the experiment. Equation (7) also indicates that the convolved signal amplitude increases with increasing ω, the r.f. frequency of the input signal.

Experimental results obtained corresponding to configurations of FIGS. 1*a* and 1*b* are quite similar to what we have observed in FIG. 1*c*.

In FIG. 1*b* the pulses to be convolved were introduced on the CdS plate by means of deposited 17 MC interdigital transducers 20, 20'. The C-axis of the CdS crystal is perpendicular to the major surface of the plate. The output terminals connected to electrodes 23 and 23' also serve as the terminals for applying d-c biasing voltage 27. In the experiment, d-c pulses of 20μsec duration were used as biasing voltage 27 to avoid excessive heating. The crystal conductance was controlled by a tungsten light source. The curve 102 in FIG. 5 shows the amplitude of the convolved signal, $V_{oc}(2\omega t)$ as a function of the pulsed d-c field. FIG. 6 shows a series of pictures corresponding to most points on curve 102 in FIG. 5.

What is claimed is:

1. A device for performing the function of convolution, comprising:

a properly oriented piezoelectric substrate element;

first means for generating surface ultrasonic waves propagating in a first direction on said substrate;

second means for generating surface ultrasonic waves propagating in a second direction on said substrate;

conductive means forming a ground electrode on the surface of said substrate;

a semiconductor element adjacent said substrate and opposite said ground electrode;

and conductive means forming at least one electrode on the said semiconductor element for transmitting the signal representing the convolute of the ultrasonic signals generated by said first means and said second means to a load.

2. The convolver as recited in claim 1 wherein said semiconductor element can be a semiconductor layer in intimate contact with said piezoelectric substrate.

3. The convolver as recited in claim 1 wherein said means for generating ultrasonic waves produce two ultrasonic waves propagating toward each other from opposite directions.

* * * * *

UNITED STATES PATENT OFFICE

CERTIFICATE OF CORRECTION

Patent No. 3,826,932 Dated July 30, 1974

Inventor(s) WEN-CHUNG WANG

It is certified that error appears in the above-identified patent and that said Letters Patent are hereby corrected as shown below:

Column, 6, line 54, change "convolute" to -- convolution --.

Signed and sealed this 12th day of November 1974.

(SEAL)
Attest:

McCOY M. GIBSON JR.
Attesting Officer

C. MARSHALL DANN
Commissioner of Patents